(12) United States Patent
Houng et al.

(10) Patent No.: US 7,663,519 B2
(45) Date of Patent: Feb. 16, 2010

(54) ANALOG TO DIGITAL CONVERTER USING ARRANGEMENT OF STATORS AND AD CONVERTING METHOD

(75) Inventors: Young-Tack Houng, Suwon-Si (KR); Sang-Wook Kwon, Seongnam-Si (KR); In-Sang Song, Seoul (KR); Jung-Eun Lee, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 50 days.

(21) Appl. No.: 12/053,252

(22) Filed: Mar. 21, 2008

(65) Prior Publication Data
US 2009/0045985 A1 Feb. 19, 2009

(30) Foreign Application Priority Data
Aug. 16, 2007 (KR) .................. 10-2007-0082251

(51) Int. Cl.
*H03M 1/00* (2006.01)
(52) U.S. Cl. ........................ 341/137; 341/155
(58) Field of Classification Search ............. 341/137, 341/120, 155, 156, 118
See application file for complete search history.

(56) References Cited

U.S. PATENT DOCUMENTS 5,726,654 A 3/1998 Hatae et al.
6,593,870 B2 * 7/2003 Dummermuth et al. ...... 341/155
2005/0073451 A1 4/2005 Bocko et al.

FOREIGN PATENT DOCUMENTS

JP 2001-138299 5/2001
KR 10-2006-0066266 6/2006

OTHER PUBLICATIONS

International Search Report issued in counterpart International Application No. PCT/KR2008-001920, mailed Jun. 23, 2008.
Written Opinion issued in counterpart International Application No. PCT/KR2008-001920, mailed Jun. 23, 2008.
English language abstract of JP 2001-138299, published May 22, 2001.
Machine English language translation of JP 2001-138299, published May 22, 2001.
English language abstract of KR 10-2006-0066266, published Jun. 16, 2006.

* cited by examiner

*Primary Examiner*—Rexford N Barnie
*Assistant Examiner*—Joseph Lauture
(74) *Attorney, Agent, or Firm*—DLA Piper LLP US

(57) ABSTRACT

An Analog to Digital (AD) converter and an AD converting method are provided. The AD converter includes one or more stators, and one or more actuators that move according to an input voltage. The digital output of the AD converter is determined based on an arrangement of the stators and the positions of the actuators relative to the stators. The AD converter can achieve high resolution and/or high speed with lower power consumption.

36 Claims, 11 Drawing Sheets

FIG. 3

| DECIMAL VALUES | 0 | 1 | 2 | 3 | 4 | 5 | 6 | 7 | 8 | 9 | 10 | 11 | 12 | 13 | 14 | 15 | |
|---|---|---|---|---|---|---|---|---|---|---|---|---|---|---|---|---|---|
| DIGITAL OUTPUT VALUES (BINARY CODE) | 0 | 0 | 0 | 0 | 0 | 0 | 0 | 0 | 1 | 1 | 1 | 1 | 1 | 1 | 1 | 1 | MSB |
| | 0 | 0 | 0 | 0 | 1 | 1 | 1 | 1 | 0 | 0 | 0 | 0 | 1 | 1 | 1 | 1 | |
| | 0 | 0 | 1 | 1 | 0 | 0 | 1 | 1 | 0 | 0 | 1 | 1 | 0 | 0 | 1 | 1 | |
| | 0 | 1 | 0 | 1 | 0 | 1 | 0 | 1 | 0 | 1 | 0 | 1 | 0 | 1 | 0 | 1 | LSB |

ANALOG TO DIGITAL CONVERTER USING ARRANGEMENT OF STATORS AND AD CONVERTING METHOD

CROSS-REFERENCE TO RELATED APPLICATIONS

This application claims priority from Korean Patent Application No. 2007-0082251 filed on Aug. 16, 2007 in the Korean Intellectual Property Office, the entire disclosure of which is incorporated herein by reference.

BACKGROUND OF THE REFERENCE

1. Field of the Invention

Apparatuses and methods consistent with the present invention relate an Analog to Digital (AD) conversion. More particularly, the present invention relates to a parallel AD converter for converting an analog signal to a digital signal using a Micro Electro Mechanical Systems (MEMS) technology, and an AD converting method.

2. Description of the Related Art

Many natural signals change in an analog (continuous) manner as time passes. To understand the phenomena of nature, it is required to measure the magnitude of the analog signals over time. The measured values may be processed and analyzed using computers, and to do so, a device is required to convert the observed analog signal to a digital value processable by the computer. This device is an Analog-to-Digital (AD) converter.

An AD converter may be one of several different types, including, e.g., a parallel comparator type, a single-slop type, a dual-slope type, a successive approximation type, and the like. A parallel comparator type AD converter uses an OP amplifier as the comparator, and outputs a digital value, e.g., a binary code output, by encoding the output signal of the comparator, which, when an input voltage is higher than a reference voltage, outputs a voltage corresponding to the logical value '1'.

A parallel comparator type AD converter may include a plurality of resistors for setting the various reference voltages, a plurality of comparators for comparing the input voltage with each of the reference voltages, and an encoder for outputting a digital signal.

However, when the AD converter includes the multiple resistances and the multiple comparators, the resistances and the comparators consume a large amount of power. Also, to achieve higher resolution and/or higher speed, more resistors and comparators may be required, which causes even greater power consumption. Specifically, to implement an n-bit AD converter, at least $2^n$-ary resistors and $(2^n-1)$-ary comparators may be required. As the number of output bits of the AD converter increases, the power consumption increases exponentially.

Therefore, what is needed is an AD converter for achieving high resolution and/or high speed with lower power consumption.

SUMMARY OF THE INVENTION

Exemplary embodiments of the present invention address at least the above problems and/or disadvantages and provide at least the advantages described below.

The present invention has been provided to address the above-mentioned and other problems and disadvantages occurring in the conventional arrangement, and an aspect of the present invention provides an AD converter for realizing high resolution and/or high speed with lower power consumption. The AD converter and an AD conversion method determine an output value according to an arrangement of stators.

In order to achieve the above-described aspects of the present invention, an AD converter is provided, which includes: one or more stators; one or more actuators capable of moving according to an input voltage; and a digital signal generator for determining a digital output value according to the input voltage based on the arrangement of the stators and positions of the actuators in relation to the stators.

Each stator may output a voltage corresponding to a logical value 1 when the stator overlaps with anyone of the actuators, and each stator may output a voltage corresponding to a logical value 0 when the stator does not overlap with any one of the actuators.

The actuators each may include a light source, and the stators each may include an optical detector, and output the voltage according to whether a light emitted from the light source of the actuators is detected or not.

The AD converter may further include a first force applying part of a stationary comb structure; and a second force applying part connected to the actuators and having a movable comb structure to which the input voltage is applied, wherein the actuators move by a force applied between the first force applying part and the second force applying part.

According to another aspect of the present invention, an AD conversion method is provided, which includes: providing one or more stators in a predetermined arrangement; receiving an input voltage; translating the received input voltage into a change of an observable physical characteristic, the degree of the change being proportional to the received input voltage; observing by the one or more stators the change of the observable physical characteristic; and determining the digital output value according to the observed change.

According to yet another aspect, an analog to digital (AD) converter that produces a digital output of n number of bits is provided, which includes: an input port configured to receive an analog input stimuli; a translation mechanism configured to receive the analog input stimuli from the input port, and to translate the received analog input stimuli into a change of physical characteristic, the change of physical characteristic being within a predetermined range of degree of the change; a plurality of detectors arranged such that each of the plurality of detectors being positioned to produce a detection signal upon detection of an occurrence of the change being in one or more of $2^n$ number of subsets of the predetermined range of degree of the change; and an output port configured to transmit one of absence and presence of the detection signal from each of n subset of the plurality of detectors as the digital output of n number of bits.

BRIEF DESCRIPTION OF THE DRAWING FIGURES

The above and other aspects of the present invention will be more apparent by describing certain exemplary embodiments of the present invention with reference to the accompanying drawings, in which:

FIG. 3 is a table of output values from the AD converter according to an exemplary embodiment of the present invention;

Throughout the drawings, the same drawing reference numerals will be understood to refer to the same elements, features, and structures.

DETAILED DESCRIPTION OF THE EXEMPLARY EMBODIMENTS

Figure 1:
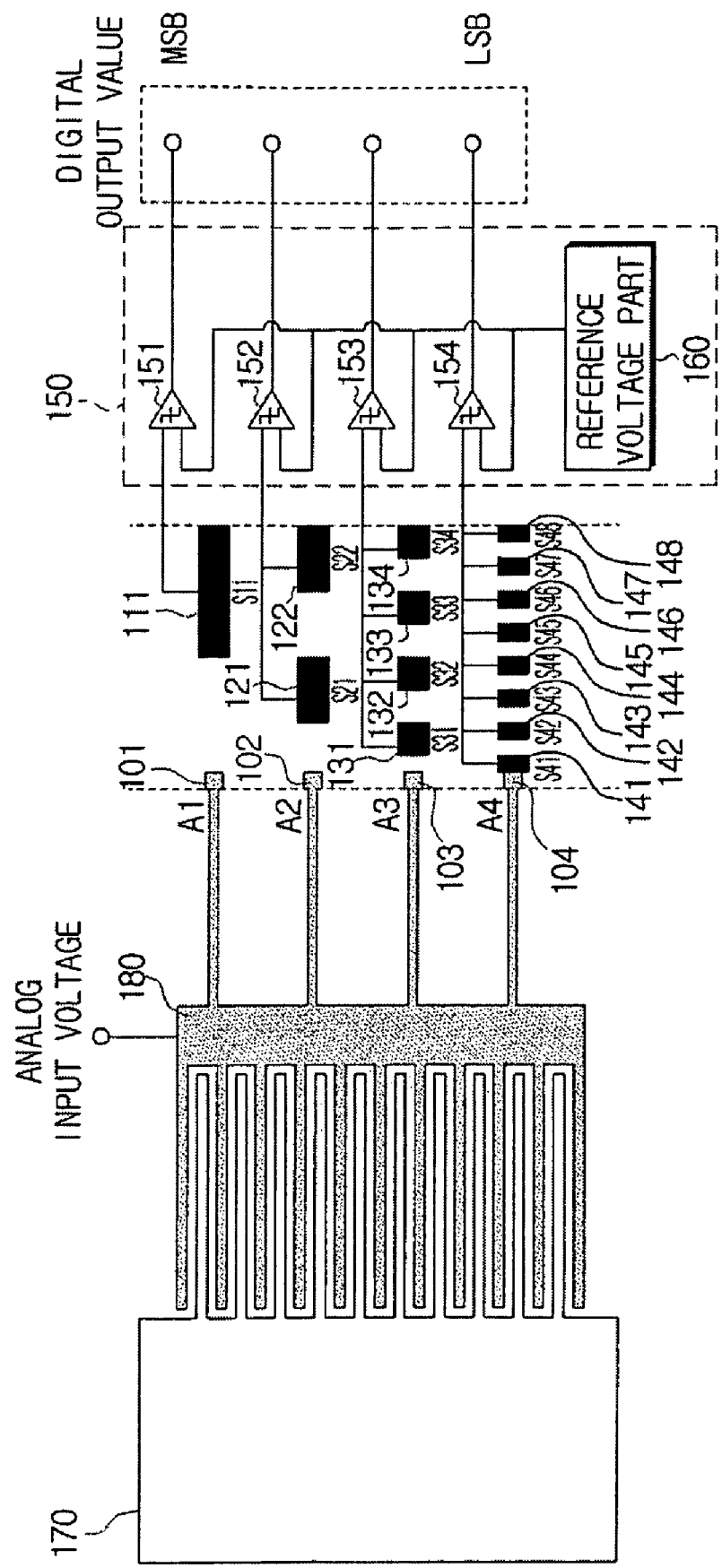
FIG. 1 is a diagram of an AD converter according to an exemplary embodiment of the present invention.

Certain exemplary embodiments of the present invention will now be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

While throughout the following description embodiments of AD converter are described as receiving a voltage as the input stimuli or stimulus, this is only for the sake of the brevity of the description, and is not intended to so limit the scope of the inventive aspects. Indeed, it should be understood, and readily apparent to those skilled in the art, that the input can take any form of stimuli, including voltage, current or any other form of quantifiable energy.

The received analog stimuli is translated by one or more translator mechanism into a linear change in certain physical characteristic that can be detected by a set of discrete detectors arranged in a configuration such that each of the detectors detect a discrete subset of the degree of change in the physical characteristic, and such detection by the set of detectors are collectively taken as a certain number of bits of digital output.

According to one aspect of the invention, an AD converter may be fabricated using, e.g., the Micro Electro Mechanical Systems (MEMS) technology. The MEMS is also referred to as a micro system, a micro machine, a micro mechatronics, and the like. For example, FIG. 1 shows a functional block diagram of the relevant portions of an AD converter according to an embodiment of the present invention. In particular, FIG. 1 shows a 4-bit AD converter which outputs a 4-bit digital value.

The 4-bit AD converter of FIG. 1 includes four actuators 101 through 104, fifteen stators 111 through 148, a digital signal generator 150, a first force applying part 170, and a second force applying part 180. The digital signal generator 150 includes four comparators 151 through 154 and a reference voltage part 160.

In the example shown in FIG. 1, the actuators 101 through 104 are conductive rectangular plates of a certain size. It should be understood however that the shape of the actuators 101 through 104 can vary, and that the actuators 101 through 104 can be made from various materials other than conductive plates. For example, rather than or in addition to being conductive, the actuators 101 through 104 may each include a light source detectable by one or more of the stators 111 through 148.

In the embodiment shown, the number of the actuators 101 through 104 is the same as the number of the bits of the AD converter. That is, in this embodiment, the AD converter includes four actuators, namely, the first actuator 101, the second actuator 102, the third actuator 103, and the fourth actuator 104. Hereafter, the actuators 101 through 104 are referred to as A1 101 through A4 104. The A1 101 is used to implement the Most Significant Bit (MSB) while the A4 104 is used to implement the Least Significant Bit (LSB) as shown in FIG. 1.

The actuators 101 through 104 are connected to the second force applying part 180. The higher the analog input voltage is, the more the actuators move in the direction toward the stators 111 through 148.

As the actuators 101 through 104 continue to move toward the stators, the actuators start to cover some of the stators 111 through 148. For example, when an actuator, which is in the form of, e.g., a conductive plate, is positioned at a location covering a stator, the capacitance over the stator increases. Accordingly, it is possible to determine whether an actuator is located over a stator. When an actuator includes a light source, it may be possible to determine whether the actuator is over a stator by detecting the light at the stator.

While the stators 111 through 148 are shown and described as rectangular conductive plates of fixed sizes, the stators 111 through 148 may also be in various shapes of different sizes.

According to this embodiment, to implement an n-bit AD converter, $(2^n-1)$-ary stators are required. For example, to implement the 4-bit AD converter of FIG. 1, fifteen stators 111 through 148 are required. In an alternative embodiment, in which the digital output value is expressed in Gray code, the AD converter can be implemented using only $2^{n-1}$-ary stators as will further described in detail later.

The stators 111 through 148 can be arranged in rows, the number of which indicating the number of bits of the digital output. The number of the stators arranged in one row varies depending on the bit corresponding to the very row. For example, the number of the stators in the row corresponding to the i-th bit is $2^{i-1}$ in the example of 4-bit AD converter with binary code output. That is, the row indicating the MSB includes one stator, the row indicating the second highest bit includes two stators, the row indicating the third bit includes four stators, and the row indicating the LSB includes eight stators. In comparison, if the Gray code is output the AD converter can be implemented using a smaller number of the stators.

The stators in the same row may be electrically connected to each other. Hence, when the actuator is located over any one of the stators in the same row, the output value for the row becomes the voltage corresponding to a logical value '1'.

The digital signal generator 150 determines the digital output value based on the input voltage, based on the configuration of the stators 111 through 148 and on the positions of the actuators 101 through 104 relative to the stators 111 through 148.

The comparators 151 through 154 compare the output value from the stators with a reference value output from the reference voltage part 160. When the output voltage of the stator is higher than the reference voltage, the comparator outputs the voltage corresponding to the logical value '1'. When the output value of the stator is lower than the reference voltage, the comparator outputs the voltage corresponding to the logical value '0'.

As many comparators as the bits of the AD converter may be required. For example, an n-bit AD converter can be implemented with n-ary comparators. In the 4-bit AD converter example, four comparators 151 through 154 are provided.

The reference voltage part 160 outputs the reference voltage for the comparison of the comparators 151 through 154.

The first force applying part 170 and the second force applying part 180 cooperate to affect the movement of the actuators 101 through 104 depending on the force applied between them. The first force applying part 170 may be stationary, and may have a comb structure. The second force applying part 180 is connected to the actuators 101 through 104. An analog input voltage is applied to the second force applying part 180. The second force applying part 180 moves according to the applied input voltage. The second force applying part 180 may also have a comb structure, and engages with the first force applying part 170.

The first force applying part 170 is grounded or is applied a certain voltage. The analog input voltage is applied to the second force applying part 180. Thus, the electrical potential difference is generated between the first force applying part 170 and the second force applying part 180. As a result an electrostatic force is caused. The electrostatic force causes the second force applying part 180 to move and the connected actuators 101 through 104 to move as well. The second force applying part 180 linearly moves according to the magnitude of the applied input voltage.

While the first force applying part 170 and the second force applying part 180 are of the comb structure by way of example, the actuators 101 through 104 may have other shapes.

Figure 2:
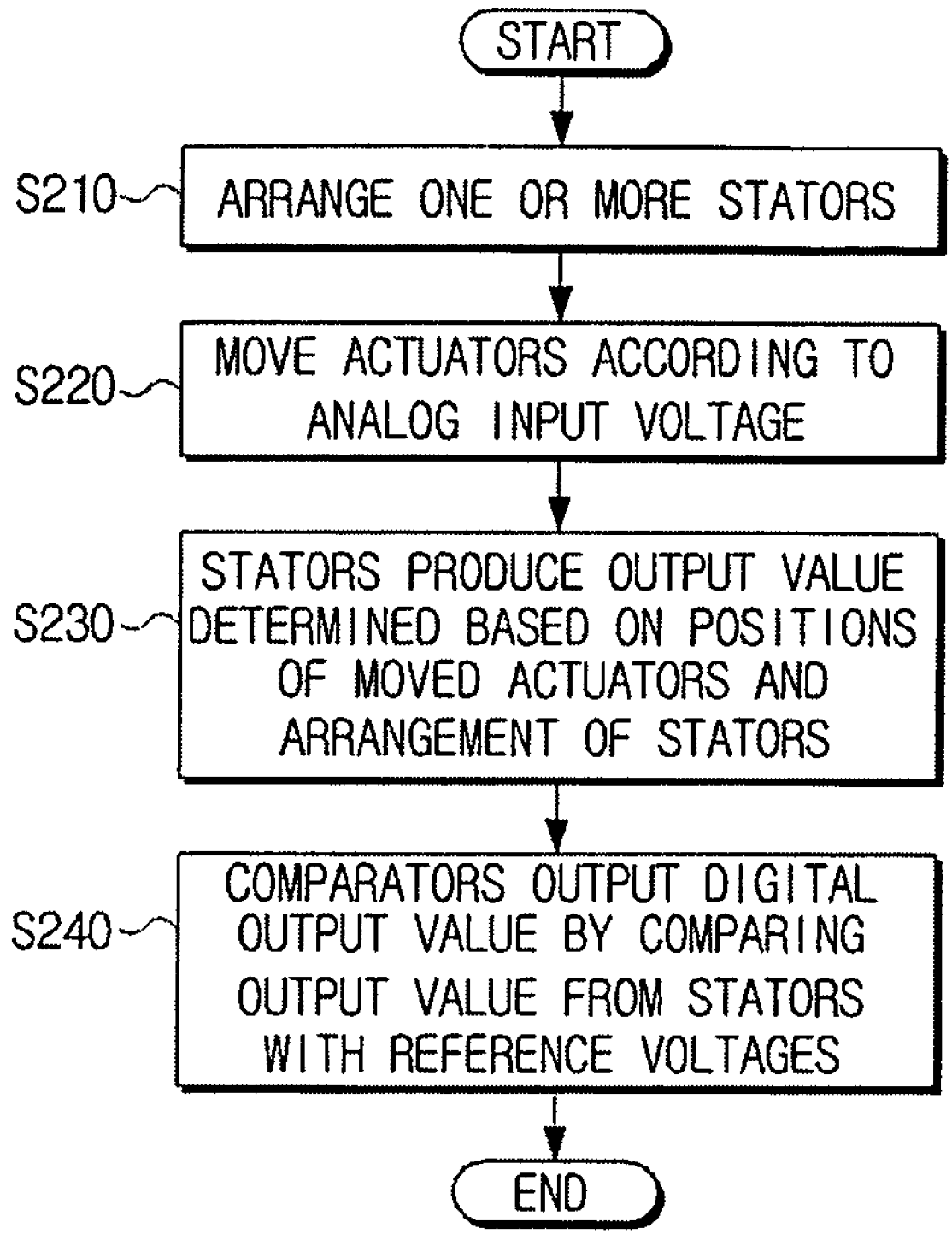
FIG. 2 is a flowchart of an AD converting method according to an exemplary embodiment of the present invention.

Now, an AD converting method is explained by referring to FIG. 2. FIG. 2 is a flowchart of an AD converting method according to an exemplary embodiment of the present invention.

One or more stators are arranged (S210). The number of the stators depends on the number of the bits of the AD converter. In this embodiment fifteen stators 111 through 148 are arranged to implement the 4-bit AD converter. As mentioned earlier, the stators 111 through 148 may be arranged in rows.

When an analog input voltage is applied, the actuators 101 through 104 move according to the analog input voltage (S220). The force is linearly applied to the first force applying part 170 and the second force applying part 180 according to the magnitude of the analog input voltage. Hence, the second force applying part 180 moves and the connected actuators 101 through 104 also move to specific positions in relation to the applied analog input voltage.

The output values of the stators are determined based on the positions of the actuators 101 through 104 on, and the arrangement of, the stators 111 through 148 (S230). When one of the actuators 101 through 104 overlaps with the stators 111 through 148, the voltage corresponding to the logical value '1' is output by the overlapped ones of the stators 111 through 148. When none of the actuators 101 through 104 overlaps, the voltage corresponding to the logical value '0' is output.

Whether the actuator overlaps with the stator can be determined based on the capacitance value. The larger the surface shared by the actuator and the stator, the greater capacitance between the actuator and the stator exists. Hence, as the surface shared by the actuator and the stator becomes larger, the greater value is output from the stator. Accordingly, if the actuator completely overlaps with the stator, the capacitance has the greatest value and the output value becomes the greatest. The comparator determines whether the output value from the stator is higher than the reference voltage, and thus determines whether the area of overlap between the actuator and the stator is over a threshold.

Whether the actuator overlaps with the stator can be determined using methods other than the capacitance measurement. For example, the actuators 101 through 104 each may be provided with a light source while the stators 111 through 148 each may include an optical detector. When the optical detector of a stator detects the light emitted from the light source of an actuator, the actuator is located over the stator.

The digital signal generator 150 compares the output value of the stators 111 through 148 with the reference voltage at the comparators 151 through 154 and outputs the digital output value (S240). When at least one of the stators in a given row overlaps with the actuator, the comparator corresponding to the row outputs a voltage corresponding to the logical value '1'. When none of the stators overlaps with the actuator in a row, the comparator of the row outputs a voltage corresponding to the logical value '0'. As a result, the analog input voltage is converted to a digital output value.

FIG. 3 is a table of output values from the AD converter according to an embodiment. The digital output value is a binary code of four ciphers in FIG. 3. The 4-bit AD converter can produce the digital output value corresponding to the decimal numbers 0 through 15.

While the digital output value is the binary code in FIG. 3, the AD converter may produce other codes. For example, the AD converter can output a Gray code.

Operations of the AD converter according to this embodiment will be described in detail by referring to FIGS. 4, 5 and 6, in which when certain reference numerals not illustrated, they are the same as in FIG. 1.

The AD converter includes the first actuator 101, the second actuator 102, the third actuator 103, and the fourth actuator 104. Hereafter, the actuators 101 through 104 are referred to as A1 101 through A4 104.

For the stators, the rows can be numbered in the order from the most significant bit to the least significant bit. For example, for the 4-bit AD converter, the row corresponding to the MSB is assigned as the first row, the row corresponding to the LSB is assigned as the fourth row, and the row numbers are assigned to the other rows accordingly. In the same row, column numbers are given from the left to right. For the sake of easier understanding, in the following descriptions the stators may be referred to in reference to the row and column numbers. For example, the stator 111 in the first row and the first column is referred to as a S11, the stator 121 in the second row and the first column is referred to as a S21, the stator 122 in the second row and the second column is referred to as a S22, the stator 131 in the third row and the first column is referred to as a S31, the stator 132 in the third row and the second column is referred to as a S32, the stator 133 in the third row and the third column is referred to as a S33, the stator 134 in the third row and the fourth column is referred to as a S34, and so on. The stators 141 through 148 in the fourth row are respectively referred to as S41 through S48 in this manner.

Figure 4:
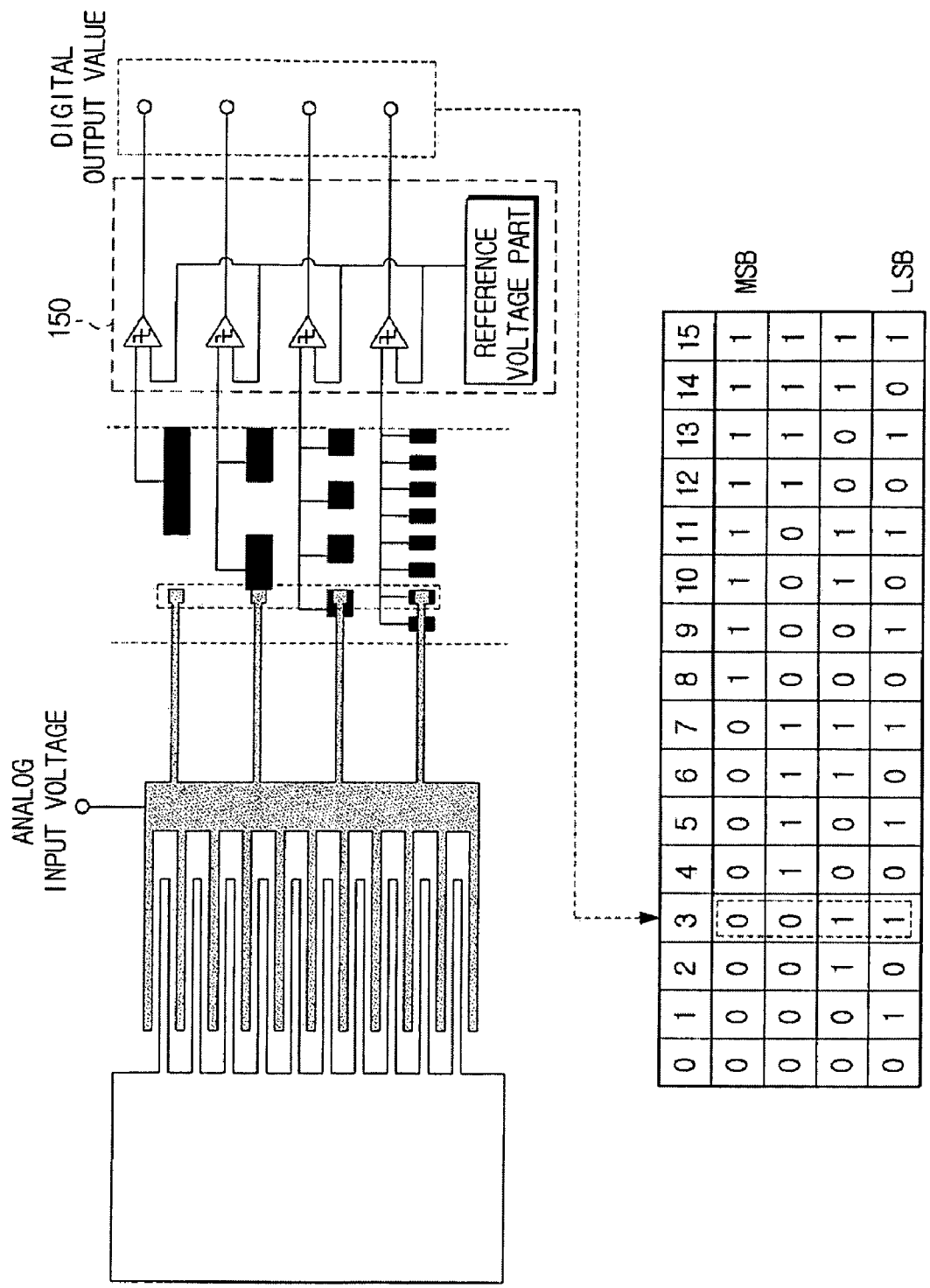
FIG. 4 is a diagram of the AD converter which outputs a decimal value '3' according to an exemplary embodiment of the present invention.

FIG. 4 is a diagram of the AD converter which outputs a decimal value '3' according to the embodiment. The actuators 101 through 104 move due to the input voltage. Since the A1 101 and the A2 102 do not overlap with the stators, the first bit and the second bit are the logical value '0.' Since the A3 103 overlaps with the S31 131 and the A4 104 overlaps with the S42 142, the third bit and the fourth bit are the logical value '1.' Thus, the digital output value is '0011,' which is equal to the decimal value '3.'

Figure 5:
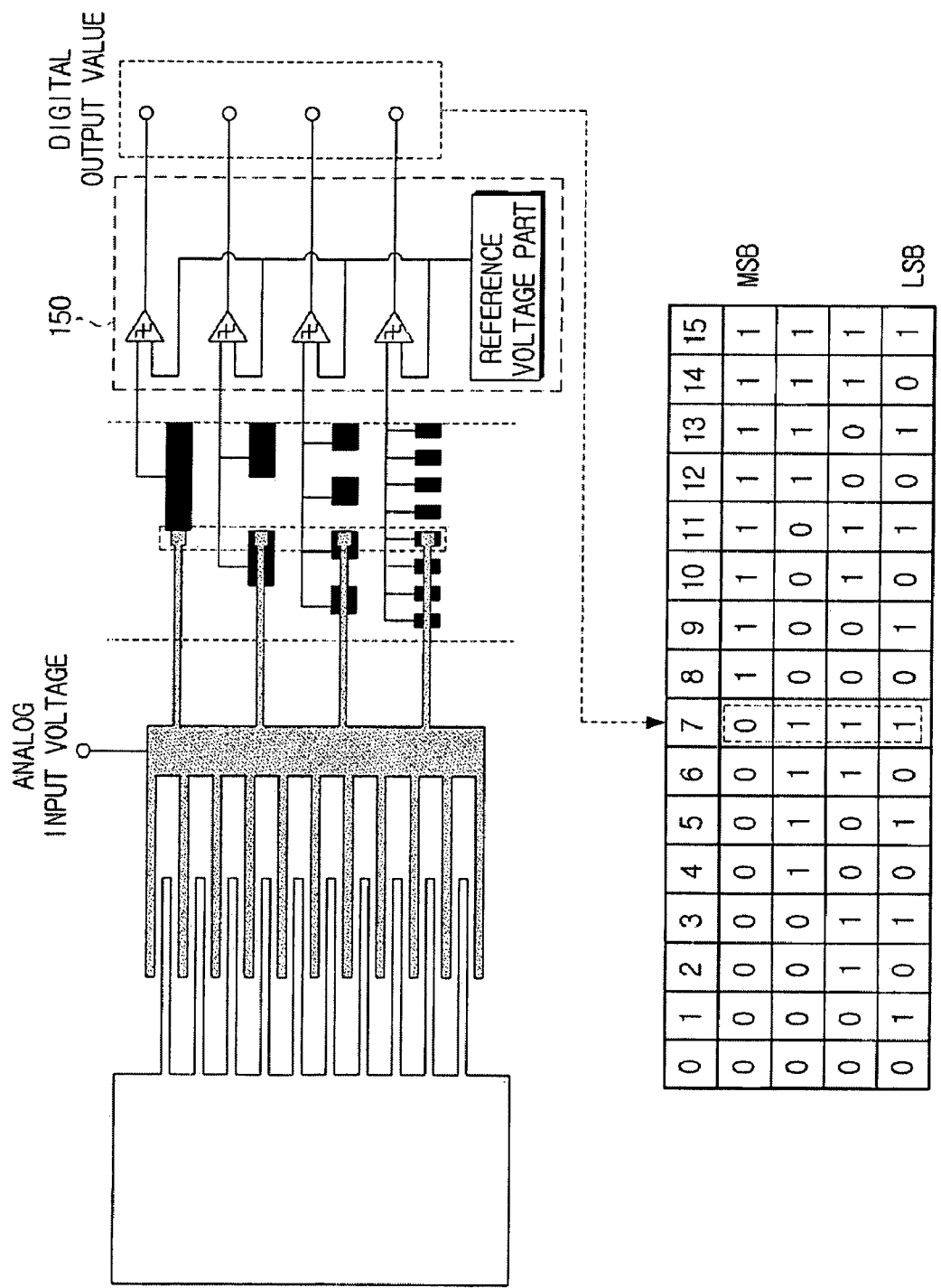
FIG. 5 is a diagram of the AD converter which outputs a decimal value '7' according to an exemplary embodiment of the present invention.

FIG. 5 is a diagram of the AD converter which outputs a decimal value '7' according to the embodiment. The actuators 101 through 104 move, further toward the stators 111 through 148 than the position shown in FIG. 4, according to the input voltage. Since the A1 101 does not overlap with the stator, the first bit is the logical value '0'. Since the A2 102 overlaps with the S21 121, the A3 103 overlaps with the S32 132, and the A4 104 overlaps with the S44 144, the second bit, and the third bit, and the fourth bit have the logical value '1.' As a result, the digital output value is '0111,' which equals the decimal value '7.'

Figure 6:
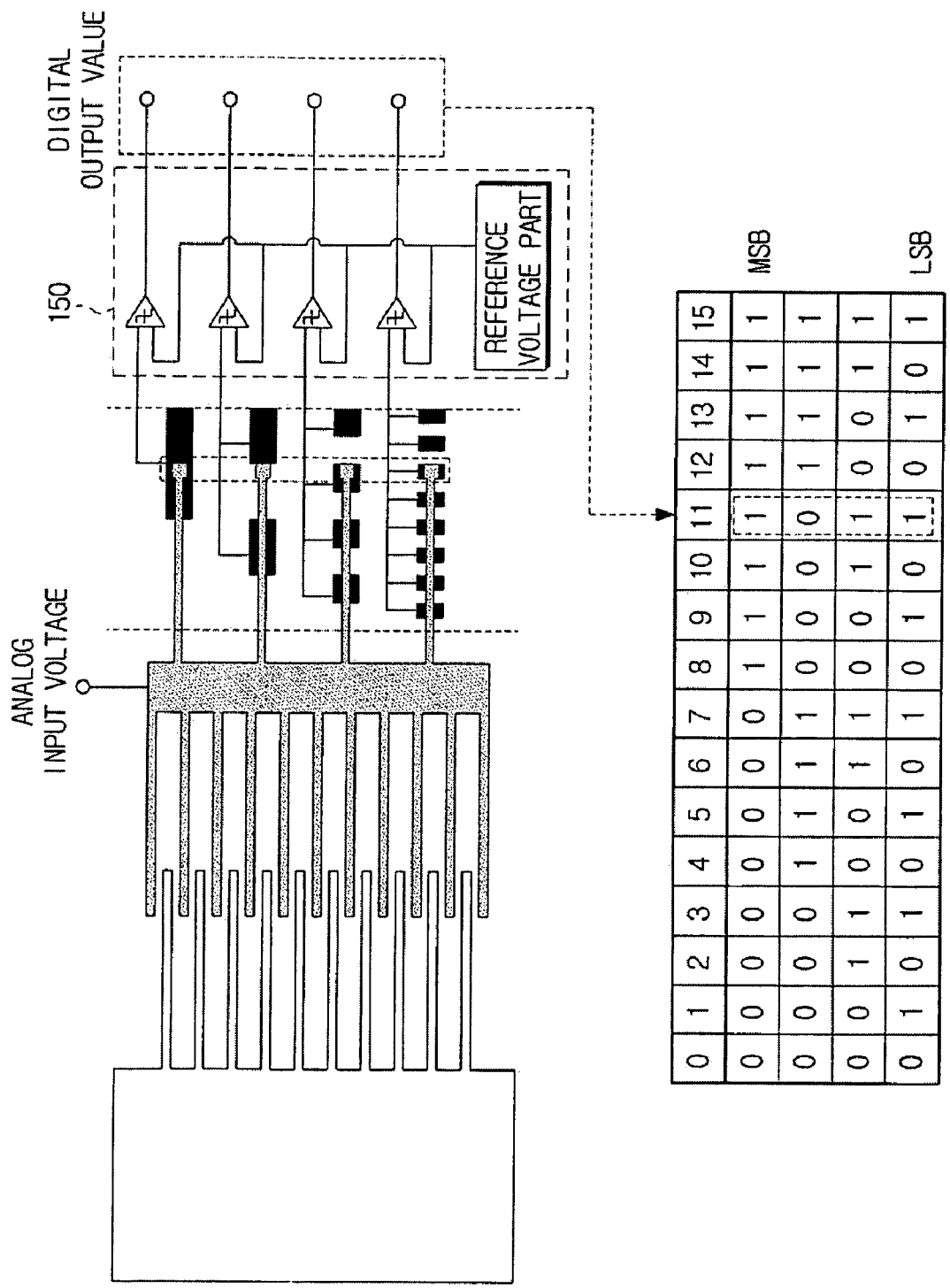
FIG. 6 is a diagram of the AD converter which outputs a decimal value '11' according to an exemplary embodiment of the present invention.

FIG. 6 is a diagram of the AD converter which outputs a decimal value '11.' The input voltage causes the actuators 101 through 104 to move to the position shown in FIG. 6. Since the A2 102 does not overlap with the stator, the second bit has the logical value '0.' Since the A1 101 overlaps with the S11 111, the A3 103 overlaps with the S33 133, and the A4 104 overlaps with the S46 146, the first, the third, and the fourth bits have the logical value '1.' Thus, the digital output value is '1011,' which equals the decimal value '11.'

While the actuators 101 through 104 have the same size in the embodiments thus far described, the actuators may have different sizes. For example, the size of the actuator may be the same as the size of the stator of the same row, which will bow be described in reference to FIG. 7.

Figure 7:
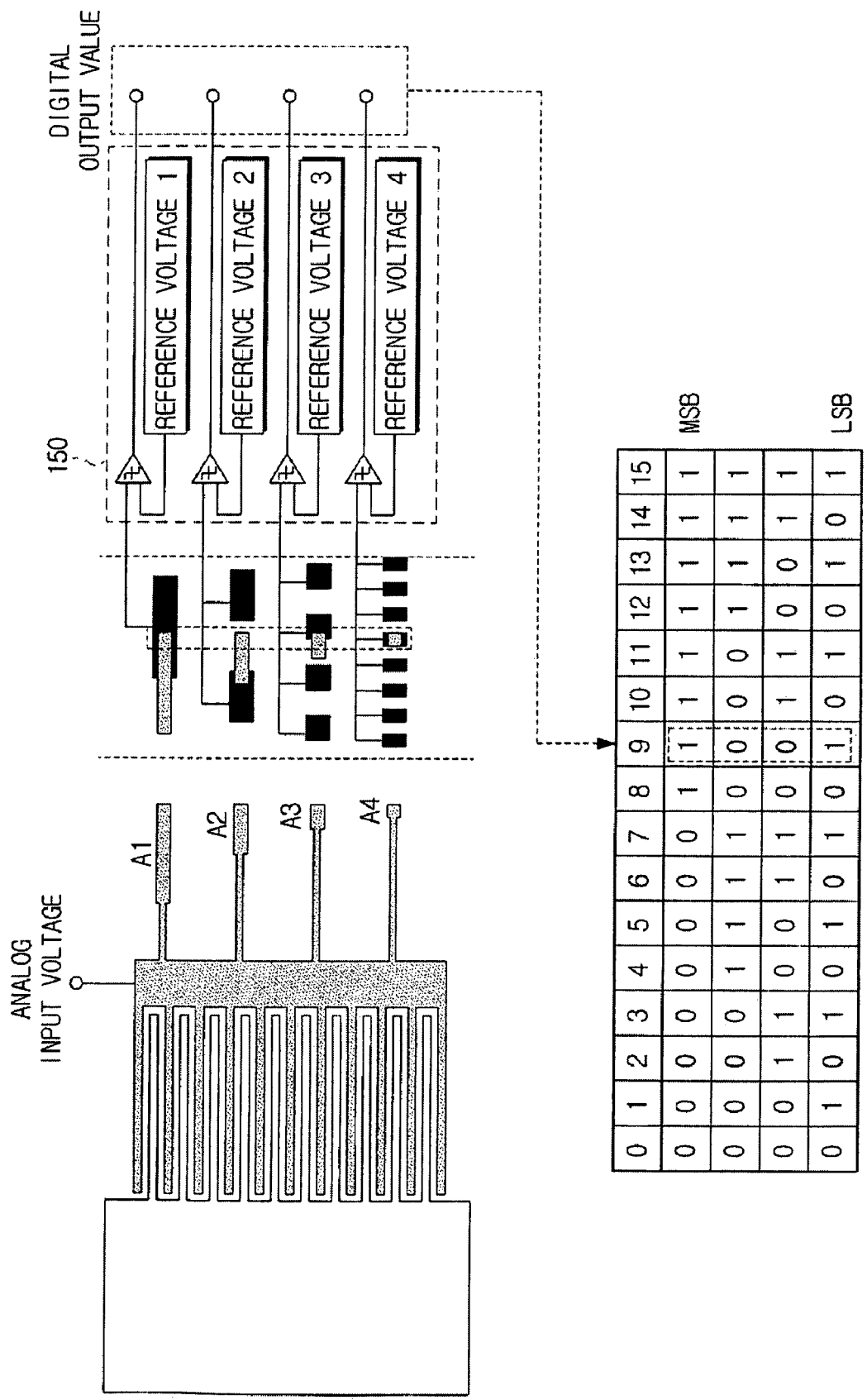
FIG. 7 is a diagram of an AD converter in which a size of an actuator is the same as a size of a stator in the same row according to another exemplary embodiment of the present invention.

In this embodiment shown in FIG. 7, the size of an actuator is the same as the size of the stator of the same row. The capacitance increases as the area of overlap of the two conductive plates increases. Accordingly, since the capacitance decreases for the smaller actuator, the sensitivity of determining whether the actuator overlaps with the stator also lowers. That is, since the sensitivity increases for the larger actuator, it may be advantageous to make the actuator larger. As a result the size of the actuator can be maximized by making the size of the actuator same as the size of the stator of the same row.

In this example, when the actuator overlaps with more than half of the surface area of a stator, the stator outputs the voltage corresponding to the logical value '1'. When the actuator overlaps with less than half of the surface area of the stator, the stator outputs the voltage corresponding to the logical value '0'. When the actuator overlaps with the half of the surface area of the stator of a row, the reference voltage input to the comparator equals the output voltage. That is, different reference voltages are applied to the respective rows.

For example, the reference voltage 1, which corresponding to the voltage A1 101 outputs when A1 101 overlaps half of the stator of the first row, is applied to the first comparator 151. The reference voltage 2, which correspond to the voltage A2 102 outputs when A2 102 overlaps half of one of the stators of the second row, is applied to the second comparator 152. The reference voltage 3, which correspond to the voltage A3 103 outputs when A3 103 overlaps half of a stator of the third row, is applied to the third comparator 153. The reference voltage 4 applied to the fourth comparator 154 corresponds to the voltage A4 104 outputs when A4 104 overlaps half of a stator of the fourth row. As can be appreciated, an AD converter can be implemented in the manner described above.

Figure 8:
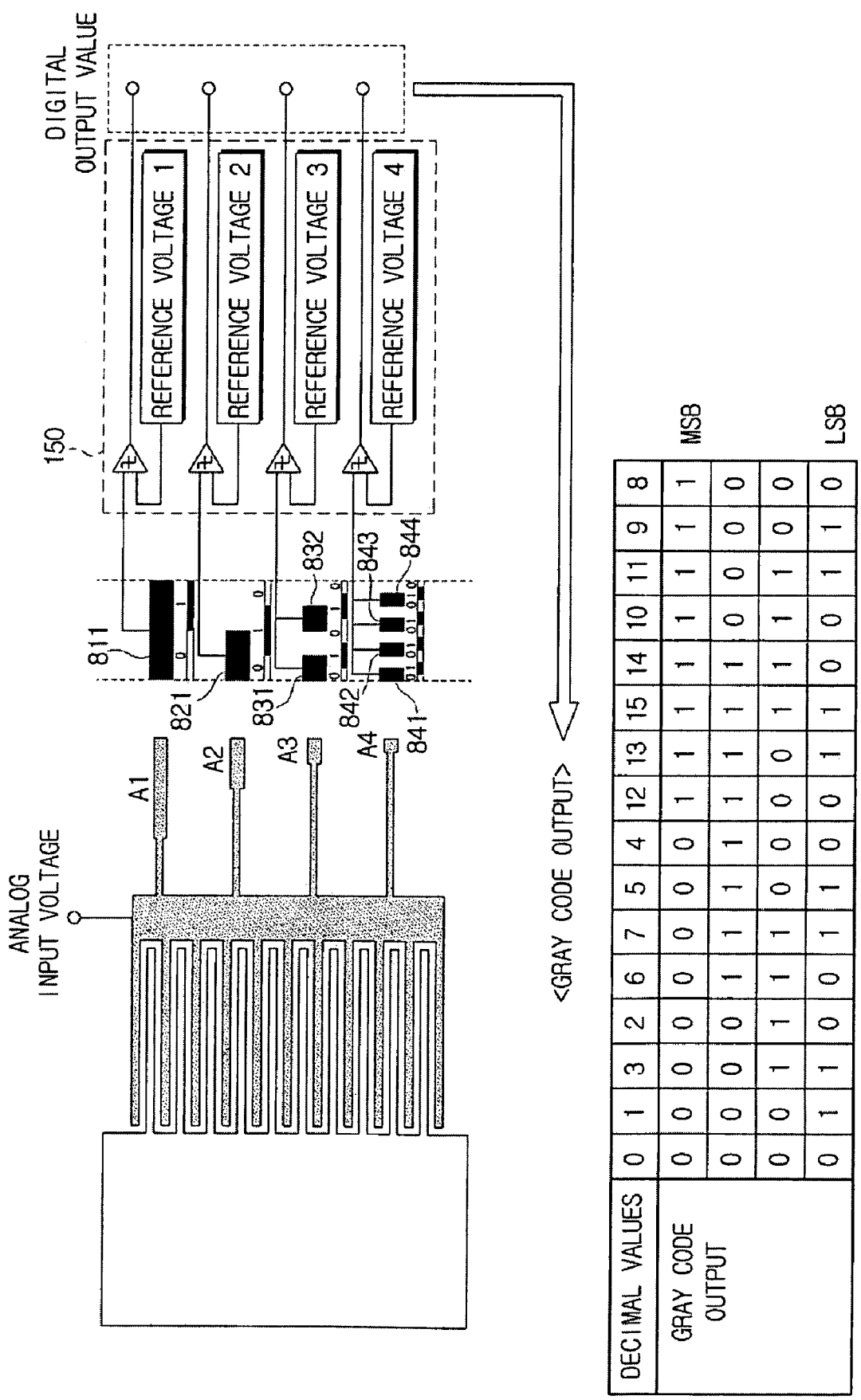
FIG. 8 is a diagram of an AD converter for outputting a Gray code according to yet another exemplary embodiment of the present invention.

FIG. 8 is a diagram of an AD converter for outputting a Gray code according to yet another embodiment. The AD converter of FIG. 8 has the similar structure as the AD converter of FIG. 7. The size of the actuators 101 through 104 is the same as the size of the respective stators 811 through 844 of the same rows. The reference voltages applied to the comparators 151 through 154 are equal to the voltages output from the stators when the actuators overlap with the half of the stator as previously described. When an actuator overlaps with a stator more than the half, the stator outputs the voltage corresponding to the logical value '1'. When the actuator overlaps with the stator less than the half, the stator outputs the voltage corresponding to the logical value '0'. Hence, different reference voltages are applied to the comparators 151 through 154 as was also previously described in connection with the embodiment of FIG. 7.

Unlike the AD converter of FIG. 7 however, the AD converter of FIG. 8 includes eight stators 811 through 844. Thus, compared with the AD converter for outputting the binary code (requiring the $(2^n-1)$-ary stators), the AD converter that implements a Gray code output may be implemented with only $2^{n-1}$-ary stators, and can thus be implemented using a smaller number of stators.

More specifically, when the stators of the AD converter for outputting the Gray code are arranged in n-ary rows, the first row includes one stator and the j-th row (j is an integer between 2 and n) includes $2^{j-2}$-ary stators. Therefore, the n-bit AD converter for outputting the Gray code requires a total of $2^{n-1}$-ary stators.

The Gray code output values are shown in the table of FIG. 8. Unlike the binary code, only one bit changes between two consecutive values. For example, the next Gray code value of '0001' is '0011,' where only the third bit changes from '0' to '1.' The next Gray code value of '0011' is '0010,' where only the fourth bit changes from '1' to '0.' The next Gray code value of '0010' is '0110,' where only the second bit changes from '0' to '1.'

Since the Gray code changes only one bit in the next code unlike the binary code, it can minimize the error. Also, it's implementation can be simpler, and can allow reduction in the total number of the stators required. However, since the decimal values corresponding to the Gray codes are not in the natural decimal order, it is necessary to rearrange the decimal values. Accordingly, an AD converter with Gray code output can be implemented in the manner described.

Figure 9:
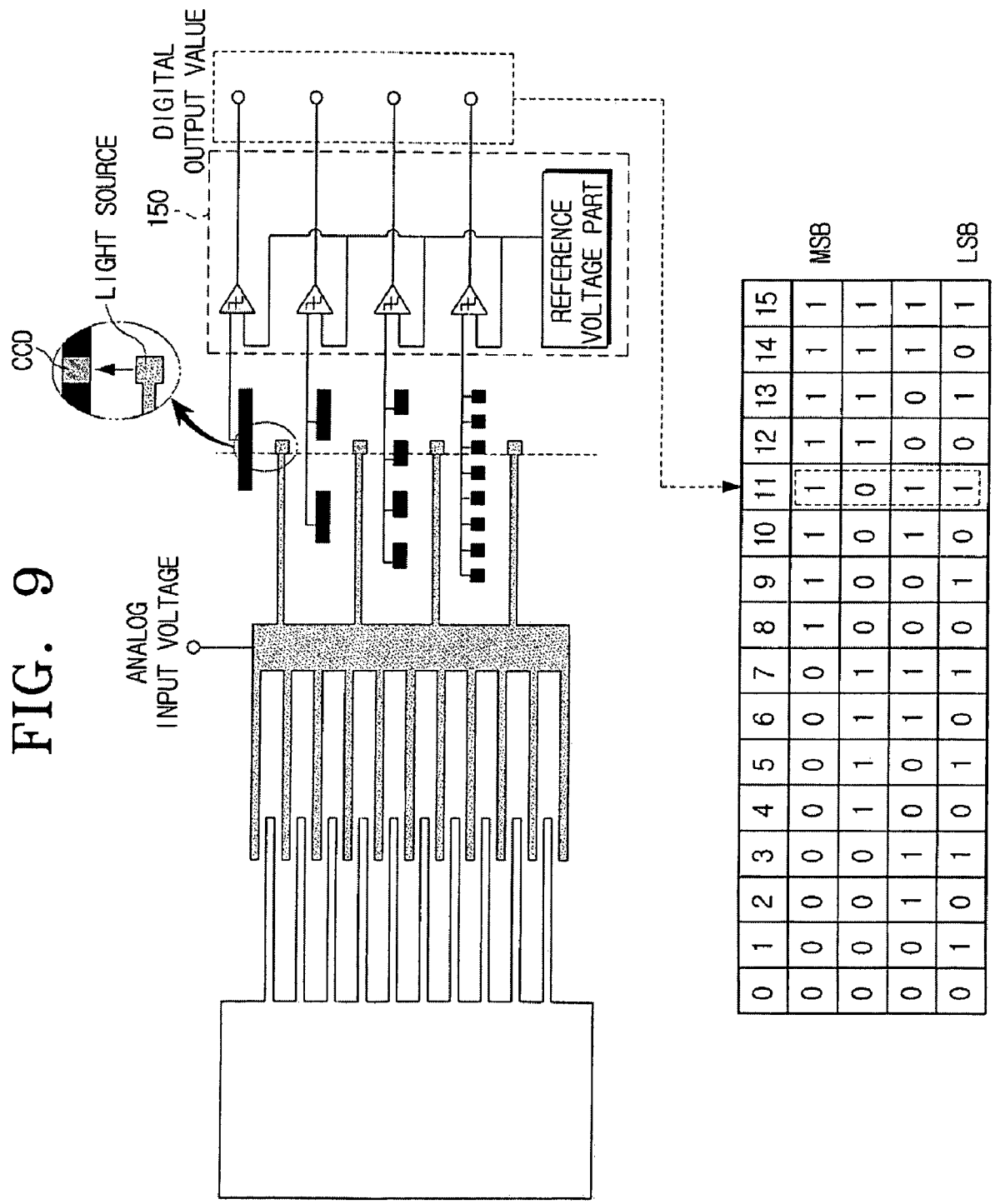
FIG. 9 is a diagram of an AD converter using an actuator including a light source according to yet another exemplary embodiment of the present invention.

The following explanations provide an AD converter, in which each actuator includes a light source, and in which each stator includes an optical detector. FIG. 9 is a diagram of an AD converter using an actuator including a light source according to yet another embodiment.

The AD converter of FIG. 9 has the similar structure as the AD converter of FIG. 1, but includes a light source in each of the actuators 101 through 104. The stators 111 through 148 each include an optical detector. The optical detector may include a Charge Coupled Device (CCD), or any other suitable image sensor.

When the light is exposed to the optical detector, a certain voltage is generated by the optical detector. The stators 111 through 148 can locate the actuator by detecting the light emitted from the light source of the actuator using the optical detector. Upon detecting the light from the actuator, the stator outputs the voltage corresponding to the logical value '1'. When no light is detected, the stator outputs the voltage corresponding to the logical value '0'.

For example, when the actuators 101 through 104 are positioned as sown in FIG. 9, as the S11 111, the S33 133, and the S46 146 can detect the light from the A1 101, the A3 103, and the A4 104, respectively (reference numerals being those indicated in FIG. 1), the first the third, and the fourth bits have the logical value '1.' On the other hand, as the stators S21 121 and S22 122 in the second row can not detect the light from the A2 102, the second bit has the logical value '0.' As a result, the output value is '1011,' which equals the decimal value '12.' Accordingly, an AD converter can be implemented by providing a light source in each of the actuators and an optical detector in each of the stators.

While the first force applying part 170 and the second force applying part 180 have the comb structure in this embodiment, they can be implemented using other structures. For example, the first force applying part 170 and the second force applying part 180 may move by an application of force using parallel plates.

While the first force applying part 170 and the second force applying part 180 are described in these embodiments to move by the electrostatic force, other types of forces, for example, piezoelectric, thermal, magnetic force, or the like, can also be used.

Figure 10:
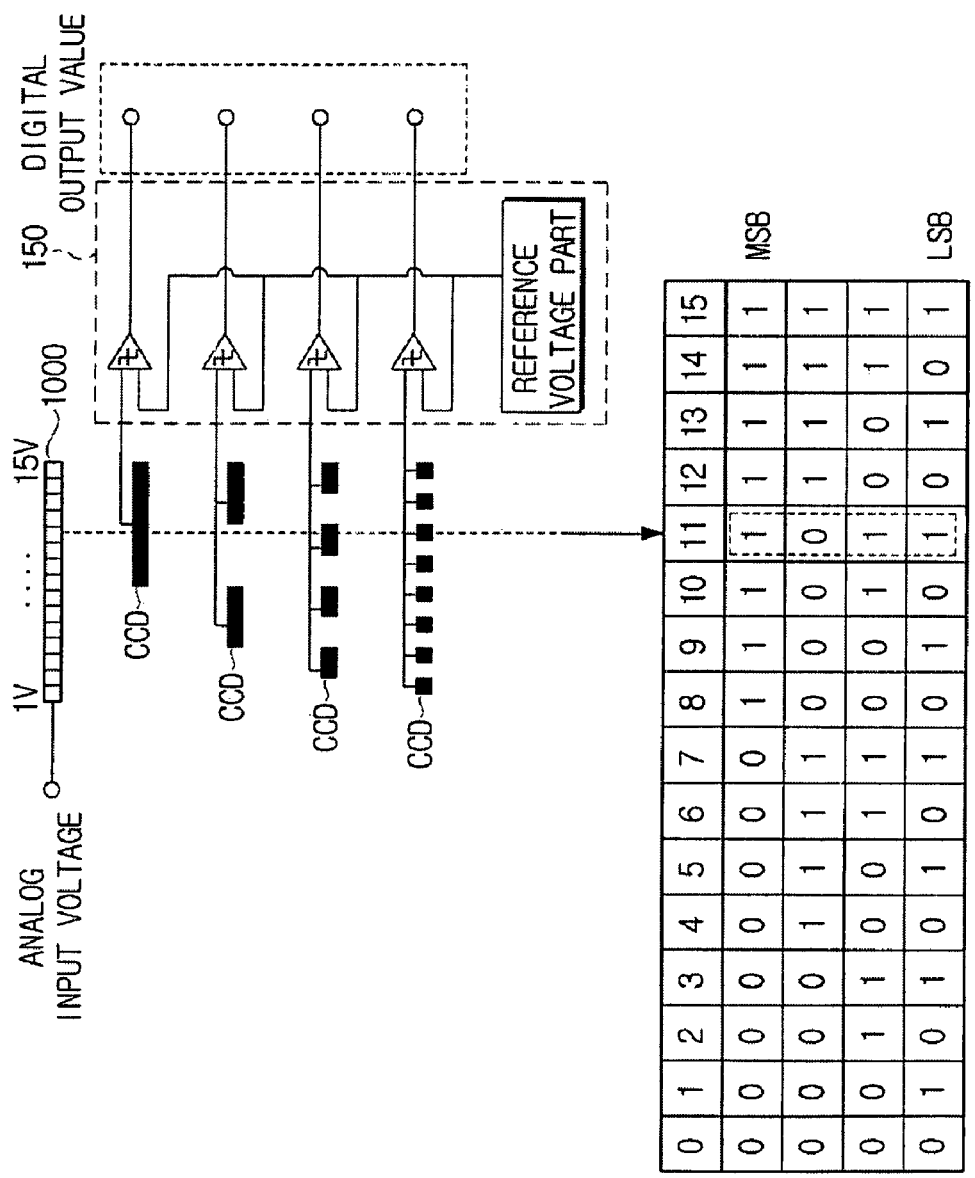
FIG. 10 is a diagram of an AD converter using a light source set which emits a light based on an input voltage according to further exemplary embodiment of the present invention.

Referring to FIG. 10, which shows an AD converter according to yet another embodiment, the AD converter does not include actuators, however, instead, includes a light source set 1000. The analog input voltage is applied to the light source set 1000. The stators 111 through 148 each include an optical detector.

The light source set 1000 includes fifteen light sources to implement a 4-bit AD converter, and operates at an input voltage range of 1V to 15V. The first light source emits light when an 1V analog input is received, and the second light source emits light at input voltage of 2V. Accordingly, the fifteen light sources have the operating voltage from 1V to 15V. An examples of such a light source include a hybrid laser source.

When the analog input voltage is applied, the light source operating at the corresponding voltage emits the light. The light is applied to a specific row in the matrix of the stators 111 through 148. Since the stators 111 through 148 each include the optical detector, the stator exposed to the light produces the voltage corresponding to the logical value '1' and the stator not exposed to the light produces the voltage corresponding to the logical value '0'.

In the example of FIG. 10, the analog input voltage is 11V, the eleventh light source operating at 11V emits the light. The light from the eleventh light source is applied to S11 111, S31 131, and S46 146. Accordingly, the output values from the first, third, and fourth rows are the logical value '1,' and the output value from the second row is the logical value '0'. Finally, the digital output value is '1011,' which equals the decimal value '11.' Thus, as can be appreciated, an AD converter can be implemented using the light source set 1000 instead of the actuators.

Figure 11:
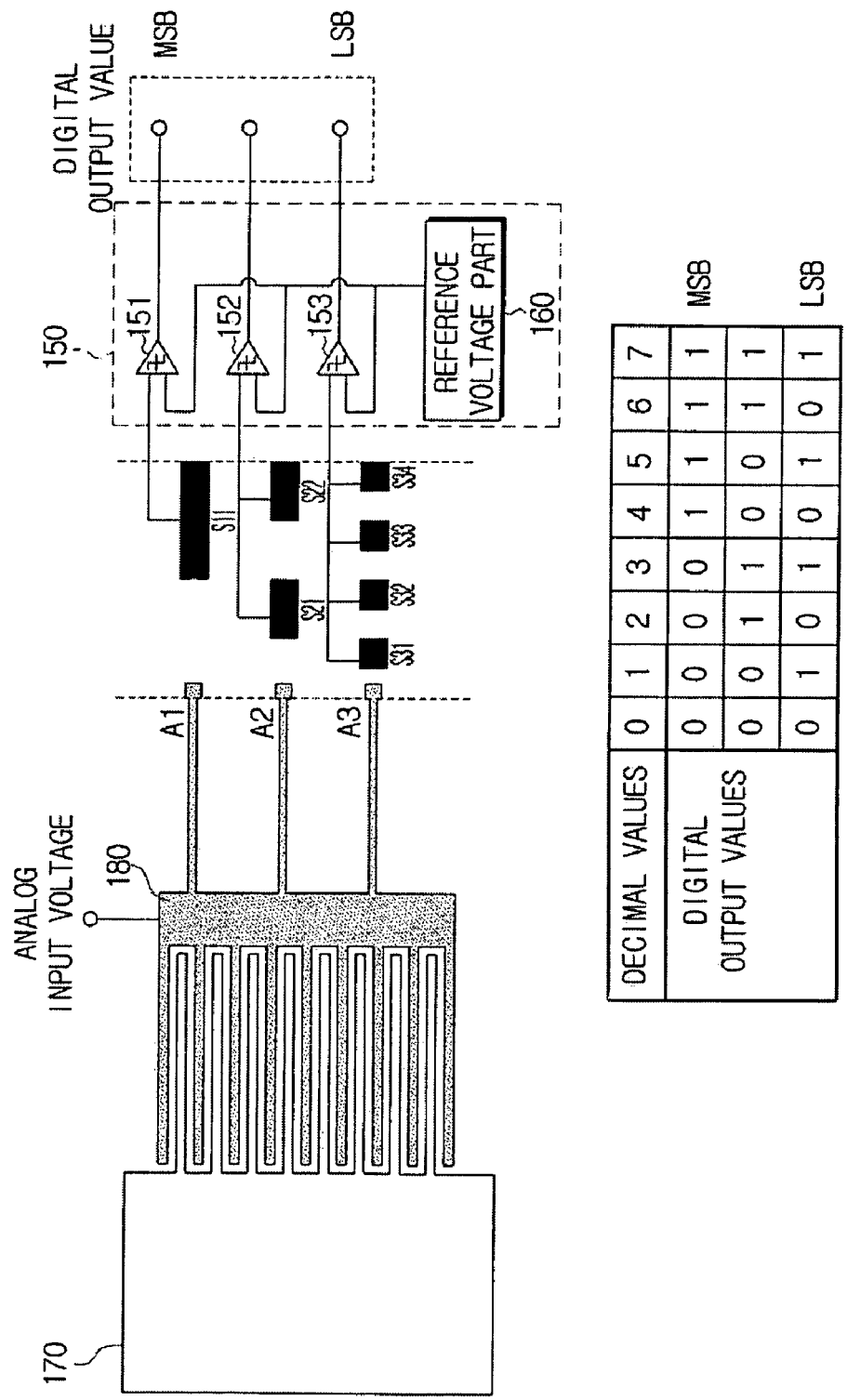
FIG. 11 is a diagram of a 3-bit AD converter according to further exemplary embodiment of the present invention.

FIG. 11 is a diagram of a 3-bit AD converter according to another embodiment. The structure of the 3-bit AD converter of FIG. 11 is substantially similar to that of the 4-bit AD converter of FIG. 1. Hence, explanations of the similar aspects are omitted. The 3-bit AD converter of FIG. 11 includes three actuators A1, A2 and A3, and three comparators 151, 152 and 153. Seven stators S11 through S34 form three rows.

While examples of 3-bit and 4-bit AD converter has been provided, it should be readily apparent to those skilled in the art that any other number of bits AD converters can be implemented in the manner described. For example, an n-bit AD converter can include n-ary actuators, $(2^n-1)$-ary stators, and n-ary comparators. An AD converter for outputting the Gray code shown, e.g., in FIG. 8 may require a smaller number of the stators. The n-bit AD converter of FIG. 10 requires the light resource set to include $(2^n-1)$-ary light resources.

Utilizing the foregoing, an AD converter and methods of AD conversion can be implemented with arranged stators, which can achieve high resolution and/or high speed with lower power consumption. In particular, the n-bit AD converter can be implemented using the n-ary comparators, without requiring a large number of resistors.

Since the AD converter can be implemented using only the actuators and the stators without additional calibrations, the AD converter can be miniaturized and simplified. In addition, using the comb structure, the AD converter can attain high linearity.

While the invention has been shown and described with reference to certain embodiments thereof, it will be understood by those skilled in the art that various changes in form and details may be made therein without departing from the spirit and scope of the invention as defined by the appended claims and the full scope of equivalents thereof.

What is claimed is:

1. An Analog to Digital (AD) converter, comprising:
   one or more stators arranged in a predetermined configuration;
   one or more actuators configured to move according to an input voltage; and
   a digital signal generator configured to determine a digital output value according to the input voltage based on the relative positions of the one or more actuators with respect to the one or more stators,
   wherein each of the one or more stators selectively outputs one of a first voltage and a second voltage according to whether the stator is overlapped by any one of the one or more actuators.

2. The AD converter of claim 1, wherein each of the one or more stators outputs the first voltage corresponding to a logical value 1 when the stator is overlapped by any one of the one or more actuators, and each of the one or more stators outputs the second voltage corresponding to a logical value 0 when the stator is not overlapped by any one of the one or more actuators.

3. The AD converter of claim 1, wherein the one or more actuators each comprise a light source, and
   the one or more stators each comprise an optical detector, each of said one or more stators outputting the voltage when a light emitted from the light source is detected.

4. The AD converter of claim 1, wherein the one or more actuators linearly move according to a magnitude of the input voltage.

5. The AD converter of claim 1, further comprising:
   one or more force applying parts which move the one or more actuators using at least one of an electrostatic force, piezoelectric force, a thermal force, and a magnetic force.

6. The AD converter of claim 1, wherein the one or more stators are arranged in as many rows as there are bits of the digital output value.

7. The AD converter of claim 6, wherein, when the one or more stators are arranged to form n-ary rows, a number of stators in an i-th row of the n-ary rows is $2^{i-1}$, i being an integer between 1 and n.

8. The AD converter of claim 7, wherein the digital signal generator outputs the digital output value corresponding to a binary code.

9. The AD converter of claim 1, wherein the AD converter is a parallel AD converter.

10. An Analog to Digital (AD) converter, comprising:
one or more stators arranged in a predetermined configuration;
one or more actuators configured to move according to an input voltage; and
a digital signal generator configured to determine a digital output value according to the input voltage based on the relative positions of the one or more actuators with respect to the one or more stators,
wherein the one or more stators output a voltage based on a capacitance value generated between the one or more stators and an overlapping one of the one or more actuators.

11. An Analog to Digital (AD) converter, comprising:
one or more stators arranged in a predetermined configuration;
one or more actuators configured to move according to an input voltage;
a digital signal generator configured to determine a digital output value according to the input voltage based on the relative positions of the one or more actuators with respect to the one or more stators,
a first force applying part of a stationary comb structure; and
a second force applying part connected to the one or more actuators and having a movable comb structure to which the input voltage is applied,
wherein the one or more actuators move by a force applied between the first force applying part and the second force applying part.

12. An Analog to Digital (AD) converter, comprising:
one or more stators arranged in a predetermined configuration;
one or more actuators configured to move according to an input voltage; and
a digital signal generator configured to determine a digital output value according to the input voltage based on the relative positions of the one or more actuators with respect to the one or more stators,
wherein the one or more stators are arranged in as many rows as there are bits of the digital output value, and
wherein the one or more actuators in a given row each have the same size, which is half of a size of ones of the one or more stators in a row corresponding to a next higher bit of the digital output value.

13. An Analog to Digital (AD) converter, comprising:
one or more stators arranged in a predetermined configuration;
one or more actuators configured to move according to an input voltage; and
a digital signal generator configured to determine a digital output value according to the input voltage based on the relative positions of the one or more actuators with respect to the one or more stators,
wherein the one or more stators are arranged in as many rows as there are bits of the digital output value, and
when the one or more stators are arranged to form n-ary rows, a first row of the n-ary rows includes one stator, and a j-th row of the n-ary rows including $2^{j-2}$-ary stators, j being an integer between 2 and n.

14. The AD converter of claim 13, wherein the size of the one or more actuators is the same as the size of the stators in the same row, and
wherein the digital signal generator outputs the digital output value corresponding to a Gray code.

15. An Analog to Digital (AD) converter, comprising:
one or more stators arranged in a predetermined configuration;
one or more actuators configured to move according to an input voltage; and
a digital signal generator configured to determine a digital output value according to the input voltage based on the relative positions of the one or more actuators with respect to the one or more stators,
wherein the one or more stators are arranged in as many rows as there are bits of the digital output value, and
wherein the size of the one or more actuators in a given row is the same as the size of the one or more stators in the same row.

16. An AD converter comprising:
a plurality of stators;
a plurality of light sources configured to emit light according to an input voltage, the plurality of light sources being equal in number as the plurality stators and being arranged such that a number of ones of the plurality of light sources that emit light depends proportionally upon the input voltage; and
a digital signal generator configured to determine a digital output value according to the input voltage based on detection by the plurality of stators of the light emitted by the plurality of light sources.

17. The AD converter of claim 16, wherein the plurality of stators each comprises an optical detector, and outputs a voltage when the light emitted from the plurality of light sources is detected.

18. An AD conversion method, comprising:
providing one or more stators in a predetermined arrangement;
receiving an input voltage;
moving one or more actuators according to the input voltage;
outputting, at one of the one or more stators, a first voltage or a second voltage according to whether the stator is overlapped by any one of the one or more actuators; and
determining a digital output value based on the relative positions of the one or more actuators with respect to the one or more stators.

19. The AD conversion method of claim 18, wherein the step of outputting comprises outputting, at one of the one or more stators, the first voltage corresponding to a logical value 1 when the stator overlaps with any one of the one or more actuators, and outputting the second voltage corresponding to a logical value '0' when the stator overlaps with none of the one or more actuators.

20. The AD conversion method of claim 18, wherein:
the one or more stators output voltages according to capacitance values generated between the one or more stators and the one or more actuators.

21. The AD conversion method of claim 18, further comprising:
providing one or more light sources that emit light at the one or more actuators, and
wherein the step of determining the digital output value comprises determining the digital output value based on detection by the one or more stators of the light emitted by the one or more light sources.

22. An analog to digital (AD) converter for producing a digital output of n number of bits, said n being an integer greater than zero, comprising:
an input port configured to receive an analog input stimuli;
a translation mechanism configured to receive said analog input stimuli from said input port, and to translate said received analog input stimuli into a change of physical characteristic, said change of physical characteristic being within a predetermined range of degree of said change;

a plurality of detectors arranged such that each of said plurality of detectors being positioned to produce a detection signal upon detection of an occurrence of said change being in one or more of $2^n$ number of subsets of said predetermined range of degree of said change; and an output port configured to transmit one of absence and presence of said detection signal from each of n subset of said plurality of detectors as said digital output of n number of bits, wherein said translation mechanism comprises:

n number of actuators configured to move toward said plurality of detectors in proportional relations to said received input stimuli, and wherein said plurality of detectors comprises:

a plurality of stators arranged into n number of rows, each of said plurality of stators positioned in $i^{th}$ row of said n number of rows being configured to produce a detection output upon detecting a presence of corresponding $i^{th}$ one of said n number of actuators, i being an integer between one and n; and n number of comparators, $i^{th}$ one of which configured to compare said detection output from each of said plurality of stators of $i^{th}$ row of said n number of rows with a reference value, and to produce said detection signal if said compared detection output exceeds said reference value.

23. The analog to digital (AD) converter according to claim 22, wherein each of plurality of stators comprises a conductive pad, and wherein:

each of said n number of actuators comprises a conductive plate, said detection output being proportional to a capacitance between said conductive pad and said conductive plate.

24. The analog to digital (AD) converter according to claim 23, wherein:

said conductive pad of each of said plurality of stators located in $i^{th}$ row having an $i^{th}$ common size, said $i^{th}$ common size being different from $(i+1)^{th}$ common size of said conductive pad of each of said plurality of stators located in $(i+1)^{th}$ row; and wherein said conductive plate of each of said n number of actuators corresponding to said $i^{th}$ row having said $i^{th}$ common size.

25. The analog to digital (AD) converter according to claim 22, wherein each of plurality of stators comprises a light detector, and wherein:

each of said n number of actuators comprises a light source, said detection output being produced by one of said plurality of stators upon detection of a light emitted from said light source of one of said n number of actuators.

26. The analog to digital (AD) converter according to claim 22, wherein said translation mechanism further comprises:

a first comb structure with a first plurality of elongated fingers, said first comb structure being connected to a first energy level;

a second comb structure with a second plurality of elongated fingers in interleaved relationship with said first plurality of elongated fingers, said second comb structure being connected to said input port to receive said input stimuli, said input stimuli providing a second energy level, said n number of actuators being coupled to said second comb structure, and a difference between said first and second energy level providing a motional force to cause said n number of actuators to move.

27. The analog to digital (AD) converter according to claim 22, wherein:

said plurality of stators comprises $2^{n-1}$ number of stators, said digital output of n number of bits corresponds to a binary code representation of said input stimuli.

28. The analog to digital (AD) converter according to claim 27, wherein:

$2^{n-1}$ number of stators from said plurality of stators being positioned in $i^{th}$ row.

29. The analog to digital (AD) converter according to claim 22, wherein:

said plurality of stators comprises $(2^n-1)$ number of stators, said digital output of n number of bits corresponds to a gray code representation of said input stimuli.

30. The analog to digital (AD) converter according to claim 29, wherein:

one stator is position in $1^{st}$ row of said n number of rows, $2^{j-2}$ number of stators from said plurality of stators being positioned in $j^{th}$ row, said j being an integer between 2 and n.

31. An analog to digital (AD) converter for producing a digital output of n number of bits, said n being an integer greater than zero, comprising:

an input port configured to receive an analog input stimuli;

a translation mechanism configured to receive said analog input stimuli from said input port, and to translate said received analog input stimuli into a change of physical characteristic, said change of physical characteristic being within a predetermined range of degree of said change;

a plurality of detectors arranged such that each of said plurality of detectors being positioned to produce a detection signal upon detection of an occurrence of said change being in one or more of $2^n$ number of subsets of said predetermined range of degree of said change; and an output port configured to transmit one of absence and presence of said detection signal from each of n subset of said plurality of detectors as said digital output of n number of bits, wherein said translation mechanism comprises:

a plurality of light sources, a number of ones of said plurality light sources emitting light being in proportional relations to said received input stimuli, and wherein said plurality of detectors comprises:

a plurality of light detectors arranged into n number of rows, each of said plurality of light detectors positioned in $i^{th}$ row of said n number of rows being configured to produce a detection output upon detecting said light from said plurality of light sources, i being an integer between one and n; and n number of comparators, $i^{th}$ one of which configured to compare said detection output from each of said plurality of light detectors of $i^{th}$ row of said n number of rows with a reference value, and to produce said detection signal if said compared detection output exceeds said reference value.

32. The analog to digital (AD) converter according to claim 31, wherein:

said plurality of light detectors comprises $2^{n-1}$ number of light detectors, said digital output of n number of bits corresponds to a binary code representation of said input stimuli.

33. The analog to digital (AD) converter according to claim 32, wherein:

$2^{n-1}$ number of light detectors from said plurality of light detectors being positioned in $i^{th}$ row.

34. The analog to digital (AD) converter according to claim 31, wherein:

said plurality of light detectors comprises $(2^n-1)$ number of light detectors, said digital output of n number of bits corresponds to a gray code representation of said input stimuli.

35. The analog to digital (AD) converter according to claim 34, wherein:

one light detector is position in $1^{st}$ row of said n number of rows, $2^{j-2}$ number of light detectors from said plurality of stators being positioned in $j^{th}$ row, said j being an integer between 2 and n.

36. The analog to digital (AD) converter according to claim 31, wherein:

said input stimuli is an analog voltage.

* * * * *